(12) United States Patent
Mitani

(10) Patent No.: US 7,948,063 B2
(45) Date of Patent: May 24, 2011

(54) SEMICONDUCTOR DEVICE WITH STRESS CONTROL FILM UTILIZING FILM THICKNESS

(75) Inventor: Hitoshi Mitani, Kanagawa (JP)

(73) Assignee: Renesas Electronics Corporation, Kawasaki-shi, Kanagawa (JP)

( * ) Notice: Subject to any disclaimer, the term of this patent is extended or adjusted under 35 U.S.C. 154(b) by 0 days.

(21) Appl. No.: 12/320,186

(22) Filed: Jan. 21, 2009

(65) Prior Publication Data
US 2009/0206410 A1 Aug. 20, 2009

(30) Foreign Application Priority Data

Feb. 20, 2008 (JP) .................................. 2008-038768

(51) Int. Cl.
*H01L 23/58* (2006.01)
*H01L 27/092* (2006.01)
*H01L 21/70* (2006.01)

(52) U.S. Cl. ................. 257/649; 257/369; 257/E27.064

(58) Field of Classification Search ........................ None
See application file for complete search history.

(56) References Cited

U.S. PATENT DOCUMENTS

| 2003/0040158 A1* | 2/2003 | Saitoh ............................ 438/279 |
| 2004/0075148 A1* | 4/2004 | Kumagai et al. ............... 257/369 |
| 2005/0093078 A1* | 5/2005 | Chan et al. ..................... 257/374 |
| 2006/0006420 A1* | 1/2006 | Goto ............................... 257/204 |
| 2006/0157795 A1* | 7/2006 | Chen et al. ..................... 257/369 |
| 2006/0214241 A1* | 9/2006 | Pidin .............................. 257/407 |
| 2006/0246672 A1* | 11/2006 | Chen et al. ..................... 438/301 |
| 2007/0259533 A1* | 11/2007 | Ahn et al. ...................... 438/778 |

FOREIGN PATENT DOCUMENTS

| JP | 2005-57301 | 3/2005 |
| WO | 02/43151 | 5/2002 |

* cited by examiner

*Primary Examiner* — Hoang-Quan T Ho
(74) *Attorney, Agent, or Firm* — McGinn IP Law Group, PLLC

(57) ABSTRACT

Semiconductor devices required forming a stress control film to handle different stresses on each side when optimizing the stress on the respective P channel and N channel sections. A unique feature of the semiconductor device of this invention is that P and N channel stress are respectively optimized by making use of a stress control film jointly for the P and N channels that conveys stress in different directions by utilizing the film thickness.

16 Claims, 5 Drawing Sheets

SEMICONDUCTOR DEVICE WITH STRESS CONTROL FILM UTILIZING FILM THICKNESS

BACKGROUND OF THE INVENTION

1. Field of the Invention

The present invention relates to a semiconductor device and manufacturing technology for that device, and relates in particular to a technology effective for applications to semiconductor devices including N-channel conductive type MISFET (Hereafter also called N channel or Nch.) and P-channel conductive type MISFET (Hereafter also called P channel or Pch.) on the same substrate and manufacturing technology for those devices.

2. Description of Related Art

Every year the performance demanded from transistors becomes ever higher due to tough demands in recent years for more performance from equipment containing semiconductor devices. One type of tough demand on transistor performance is the transistor current drive.

One technology for enhancing the current drive performance in transistors is a technology that utilizes the stress in the silicon-nitride (SiN) interlayer film to change the stress in the channel sections and boost the transistor current drive performance.

In Nch (N channels) the stress on the channel section is along the direction of the tensile force so that better current drive performance can be expected there. Conversely, in Pch (P channels) the stress on channel section is along the direction of compression so that better current drive performance can be expected there. The channel section is also called a current path.

WO2002/043151 and JP-A-2005-057301 disclose technology for regulating the stress according to the transistor polarity.

First of all in WO2002/043151, two types of stress control films are formed in different directions on the respective P and N channels, and function to regulate the stress on the respective P and N channels.

The film thicknesses of the respective stress control films also control the amount of stress on the respective P and N channels.

SUMMARY OF THE INVENTION

However, the above example of the related art requires respectively different stress control films for the P and N channels. Namely, after forming either a compression or a tensile stress control film on both the P and N channels, the process for removing one stress control film and leaving a stress control film on only either the P channel or N channel must be repeated two times, once for the P channel and once for the N channel. In other words, the number of processes is increased.

The semiconductor device of this invention is characterized in respectively optimizing the channel stress on the P channel and N channel by utilizing stress control films possessing different stress along the direction of the film thickness.

This stress control film more preferably controls the stress state of the P and N channel sections prior to forming that stress control film to the reverse of the stress state.

This stress control film further sets the direction of stress along the film thickness according to the stress on the channels of the transistor.

In the present invention as described above, the stress on the respective P and N channel sections can be controlled with good accuracy in a simple manufacturing flow by forming a stress control film jointly on the P and N channels in only one layer and then etching away this stress control film only on either the P or the N channel side.

The stress on the channel sections can in addition be controlled within a wider range by forming the stress control film according to the channel section stress state from compression to tensile, or from tensile to compression in the direction of film thickness.

DETAILED DESCRIPTION OF THE PREFERRED EMBODIMENTS

Figure 1:
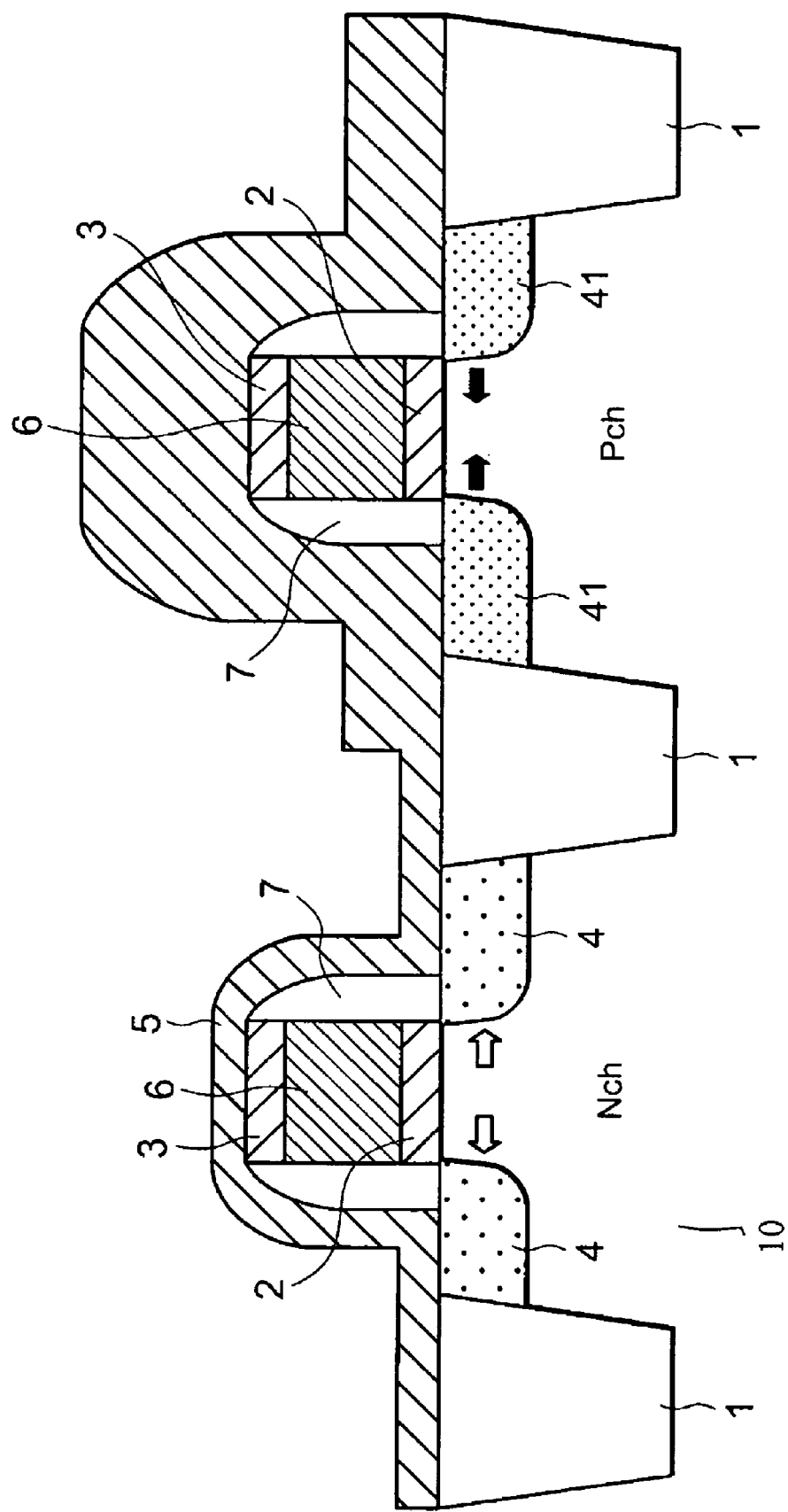
FIG. 1 is a drawing showing the cross section of the transistor of the first embodiment of this invention.

The above and other objects, features and effects of this invention will be further clarified in the following description of the embodiments of the present invention while referring to the drawings.

First Embodiment

FIG. 1 through FIG. 4 are drawings showing the semiconductor device of the first embodiment of this invention.

FIG. 1 shows the cross section along the adjoining P and N channel directions in the present embodiment. In this embodiment, the case is described where the stress on the P and N channels sections is achieved by a compressive force. The arrows in the figure show the direction of stress from an inward compressive force and an outward tensile force.

Examining the stress control film 5 as shown in FIG. 1 clearly shows that the N channel region is a thin film thickness compared to the P channel region. The stress directions are different on the respective N and P channels.

Figure 2:
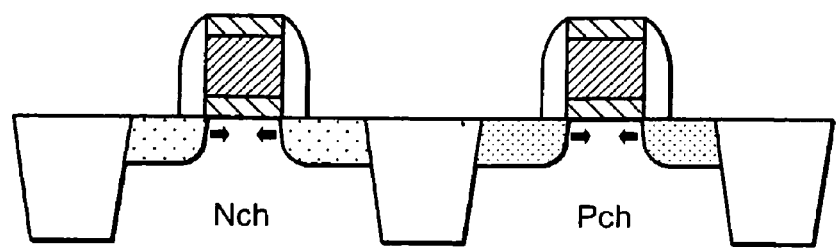
FIG. 2 is a drawing showing a portion of the manufacturing process for the transistor of the first embodiment of this invention.
Figure 3:
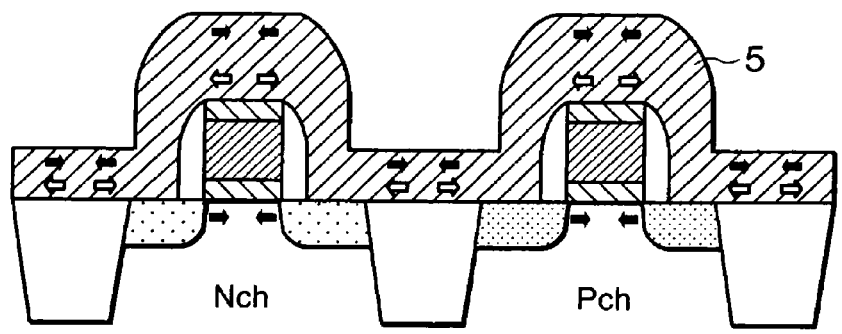
FIG. 3 is a drawing showing a portion of the manufacturing process for the transistor of the first embodiment of this invention.
Figure 4:
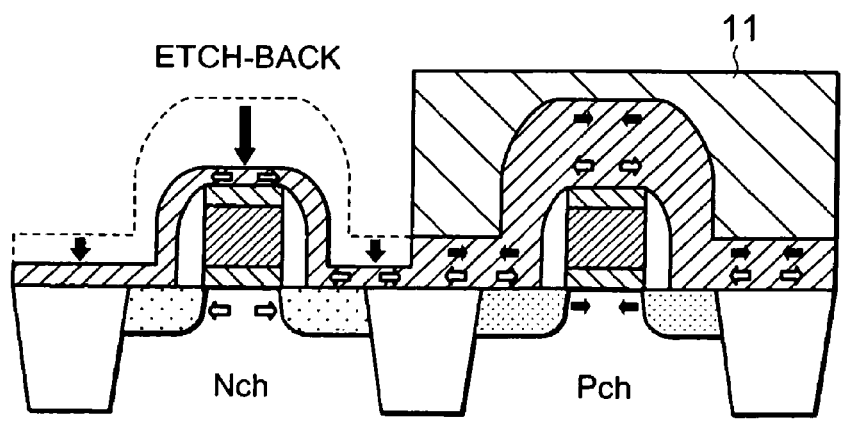
FIG. 4 is a drawing showing a portion of the manufacturing process for the transistor of the first embodiment of this invention.

The manufacturing flow in FIG. 1 is described next utilizing FIG. 2 through FIG. 4 in order to provide a more detailed description. A P channel is first of all formed on the right and an N channel on the left, enclosing the device isolation 1 on the semiconductor substrate 10. An N diffusion region 4 and a P diffusion region 41 are respectively formed to serve as the drain and source. Moreover, a gate 6 is formed by way of a gate insulation film 2 on the respective N and P channels. A sidewall insulation film 7 is also formed on the side wall of that gate. In this embodiment, the channel section for both the N channel and P channel are the stress compression directions as also shown in the figure by the arrows.

As next shown in FIG. 3, the stress control film 5 later serving as the etch-back stopper on the transistor, is jointly formed on the N and P channels. This stress control film 5 is formed (to change) from a tensile to a compression stress in the direction of the film thickness as shown by the arrows in the upper and lower two stages in the figure.

The upper and lower two stages in the figure are here described next. In the case shown by the concept diagram of this figure, the stress control film has maximum tensile stress at the bottom layer along that film thickness, and maximum compression stress at the highest layer. In other words, the stress on the stress control film gradually changes from a tensile force to a compression force along the direction of that film thickness.

In the stress control film of this embodiment, the reason that the tensile stress is at the bottom layer is due to the compression stress on the channel sections.

The film forming conditions for the above described change from a tensile to a compression stress are briefly described here. When for example forming an SiN film by the plasma CVD method, conditions are set in the initial film forming period that generate compression within the reaction chamber, and RF (high frequency) power to generate a tensile stress. Then, as the film forming progresses, the above conditions transition to conditions for generating a compression stress. Moreover, the SiN film can also be easily formed by reversing the above conditions from a compression to a tensile stress. In the present embodiment, the example described the case where SiN was the stress control film but the present invention is not limited to SiN, and any film functioning as an etching stopper and capable of controlling stress on the channel sections may be utilized.

Figure 5:
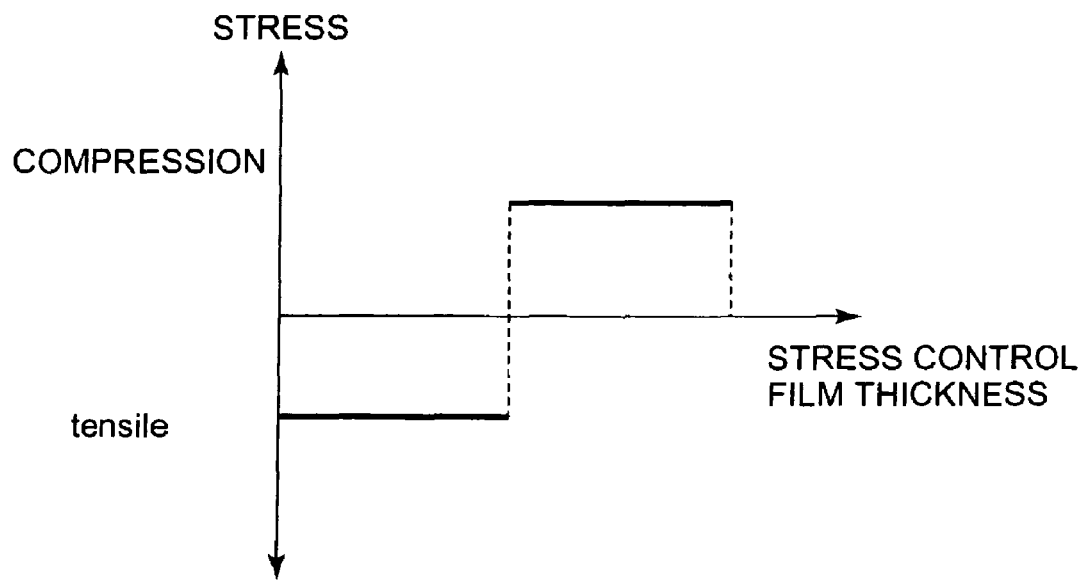
FIG. 5 is a drawing showing a portion of the manufacturing process for the transistor of the second embodiment of this invention.
Figure 6:
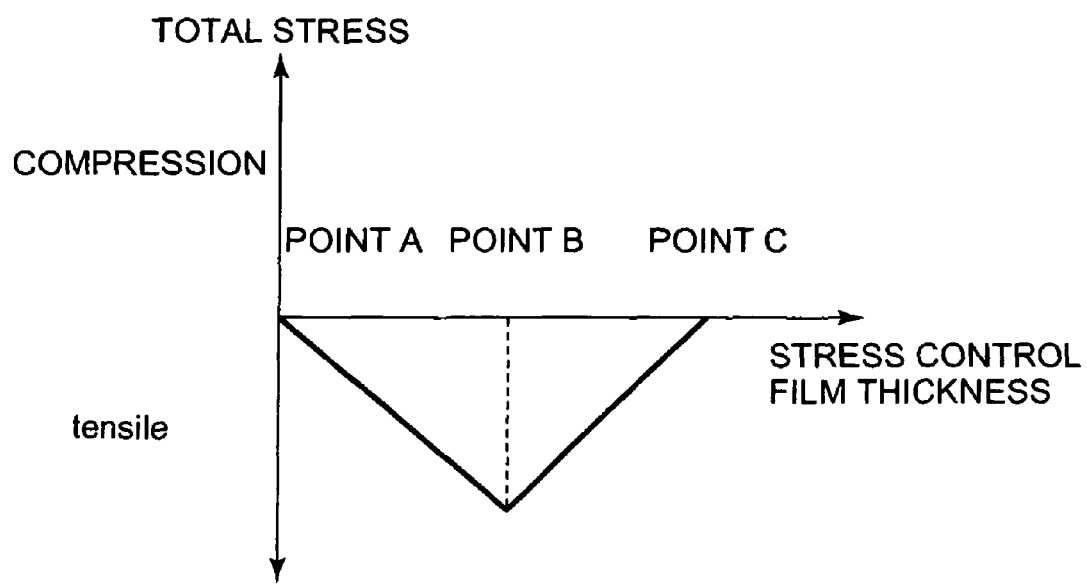
FIG. 6 is a drawing showing a portion of the manufacturing process for the transistor of the second embodiment of this invention.
Figure 7:
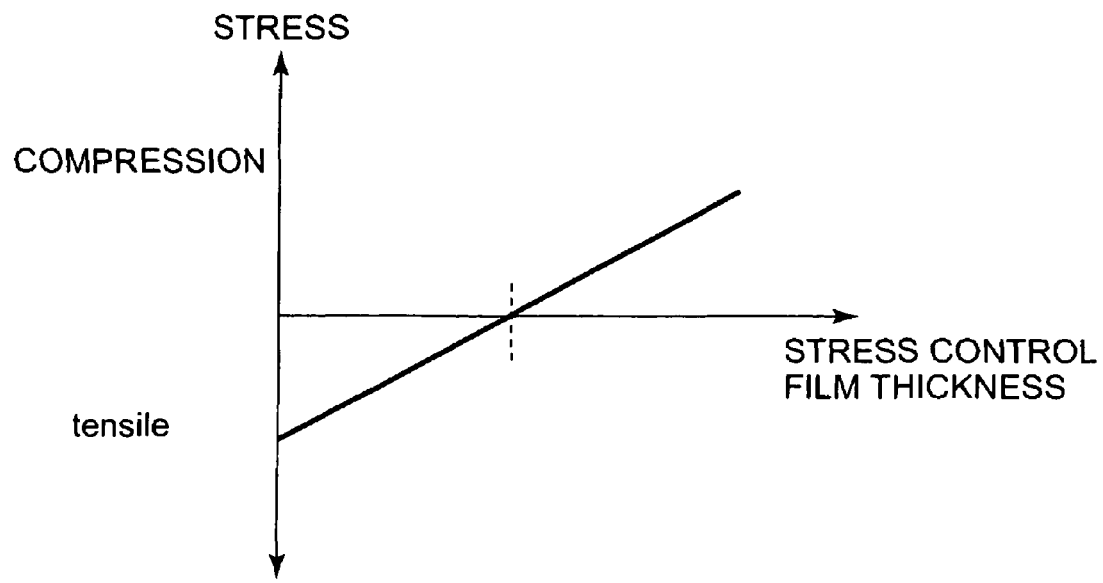
FIG. 7 is a drawing showing a portion of the manufacturing process for the transistor of the second embodiment of this invention.

The stress distribution in this embodiment is next briefly described while referring to the graphs in FIG. 5 through FIG. 8. In the initial film forming stage, a tensile force is generated in the stress control film, and a compression stress finally generated as already described. The graphs in FIG. 5 and FIG. 7 show plots of stress along the stress control film thickness on the horizontal axis, and show other stress values along the vertical axis.

The stress on the stress control film consecutively changes in stages in FIG. 5, and changes continuously in FIG. 7.

Figure 8:
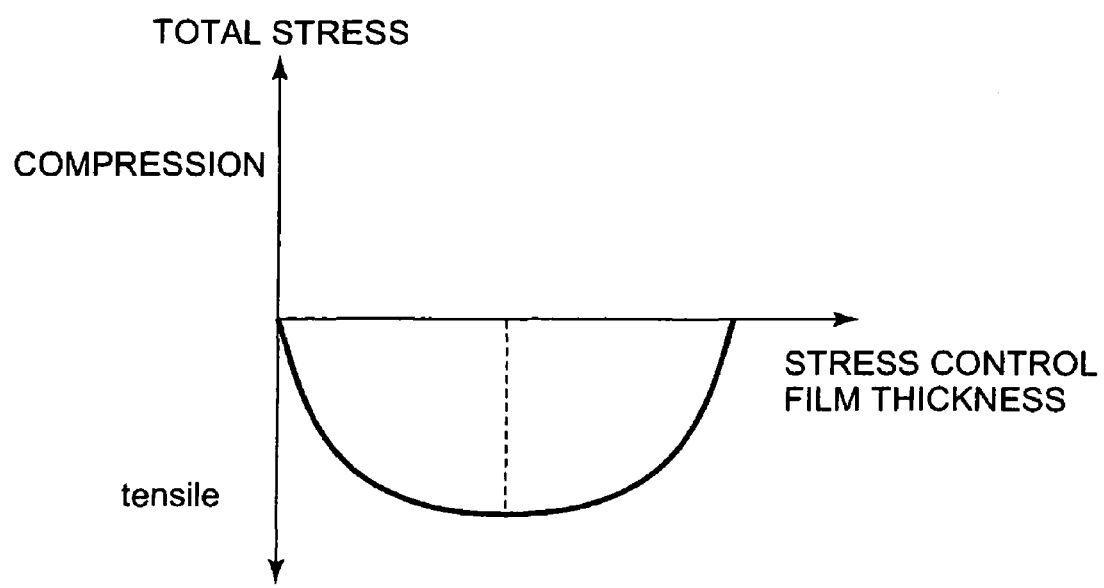
FIG. 8 is a drawing showing a portion of the manufacturing process for the transistor of the second embodiment of this invention.

FIG. 6 and FIG. 8 are graphs showing a plot of the total stress on the other points along the vertical axis versus the stress along the film thickness in the horizontal axis respectively in FIG. 5 and FIG. 7. In a detailed description of FIG. 6, the tensile stress increases from point A, and finally reaches a peak at point B. The film is then formed in the compression direction so the stress shifts toward the compression direction, and finally achieves the neutral state at point C.

FIG. 8 is the same except for the rate of change. This graph only expresses the concept type so numerical values in FIG. 6 are larger among the numerical values along the vertical axis shown in FIG. 5 and FIG. 6.

Though not plotted in FIG. 5 through FIG. 8, the C point is more than likely to be exceeded. In other words, the stress control film may even be formed extremely thick during manufacture. The stress control film thicknesses shown in FIG. 5 through FIG. 8 may be set from point A to point C, or to point C or higher as desired according to the stress needed on the channel sections.

FIG. 5 through FIG. 8 showed examples for changing the stress on the stress control film from tensile to compression. Conversely, if changing from compression to tensile, then the respective directions for compression and tensile in the figure will be reversed.

After forming this type of stress control film, a mask 11 is applied to cover just the P channel region, and the stress control film 5 on the N channel region is etched (etch back). A section of stress control film 5 with a tensile stress on the bottom layer in this way remains on the N channel region, the compression stress on the N channel section is canceled out, and is changed to a tensile stress as shown by the direction of the arrows in the figure. The channel for the P channel region is still under a compression stress. Both the N and P channels can in this way be set to the desired stress. In the figure, a stress control film directly contacts the diffusion regions 4, 41; however, a thin oxide film may in fact be present in some cases.

The subsequent processes such as forming holes in the contact performed on the transistor formed in this way are omitted here.

Second Embodiment

The second embodiment of this invention is described next while referring to FIG. 9 through FIG. 11. In the case described in the first embodiment, the channel regions below the gate are subject to a compression force after forming the gate insulation film and the N and P channel gate electrodes.

Figure 9:
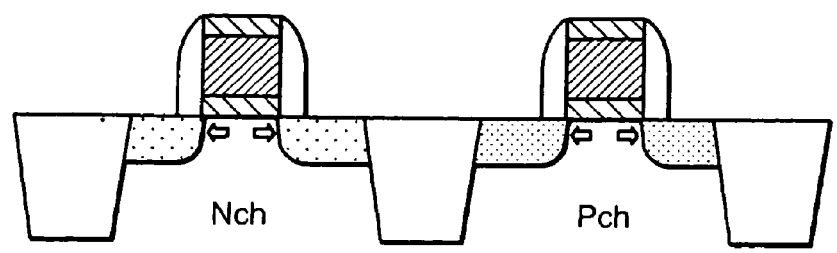
FIG. 9 is a drawing showing a portion of the manufacturing process for the transistor of the second embodiment of this invention.

Here, the case is described where each channel section of the N and P channels are subject to a tensile force as shown in FIG. 9 by the outward facing arrows.

Figure 10:
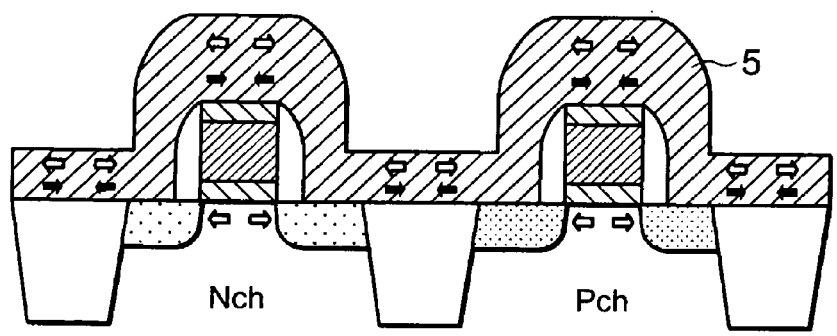
FIG. 10 is a drawing showing a portion of the manufacturing process for the transistor of the second embodiment of this invention.

Unlike the first embodiment, a stress control film 5 later functioning as an etching stopper for the transistor is formed next while conforming to the condition that the stress transitions from a compression to a tensile force along the direction of film thickness as shown in FIG. 10.

The reason the stress control film of this embodiment is subject to compression stress in the bottom layer is because there is a tensile stress on the channel section.

Figure 11:
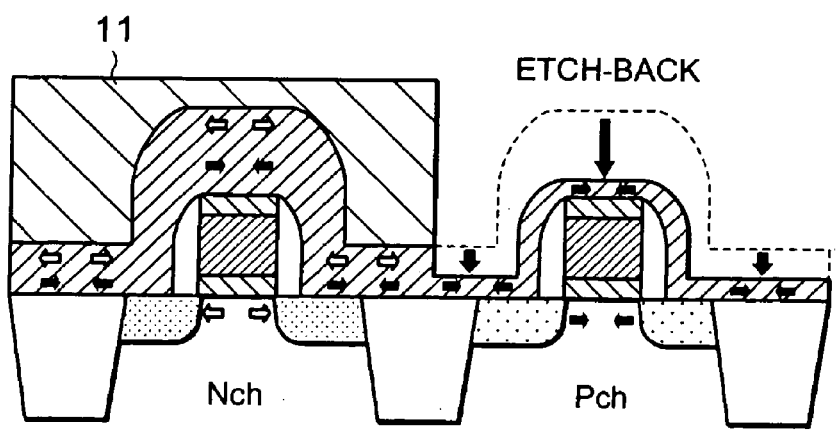
FIG. 11 is a drawing showing a portion of the manufacturing process for the transistor of the second embodiment of this invention.

A mask 11 is then applied to cover just the N channel region, and the stress control film 5 on the P channel region is etched (etch back) as shown in FIG. 11. A section of stress control film 5 with a compression stress on the bottom layer in this way remains on the P channel region, the tensile stress on the P channel section is canceled out, and is changed to a compression stress as shown by the direction of the arrows in the figure. The channel in the N channel region remains a tensile stress. Consequently, a tensile stress can be generated on the N channel section, and a compression stress generated on the P channel section the same as in the first embodiment.

The present invention is not limited to the above described embodiments and as is apparent to those skilled in the art the embodiments maybe modified as desired. In the first and second embodiments for example, immediately after forming the stress control film, the stress control film was etched back in order to optimize the stress on the channel sections of the transistor, however the invention is not limited to this method. In other words, when the stress on the channel regions tended towards either the compression or tensile direction in the subsequent manufacturing processes, there was no need to optimize the stress on the channel sections ahead of time according to the type of stress immediately after forming the above described stress control film. The thickness of the initial stress control film for example may be set for the C point or higher in FIG. 6. Moreover the stress control film itself is not limited to silicon-nitride (SiN) film.

Moreover, a conventional bulk type transistor was utilized here however the invention is not limited to this type of transistor, and Silicon-On-Insulator (SOI) type transistors may also be utilized. Also, if forming a stress film to control the stress on the channel sections then needless to say, a fin-shaped FET (FinFET) may also be utilized.

What is claimed is:

1. A semiconductor device, comprising:
    a metal-insulator-semiconductor field-effect transistor (MISFET) of one conductivity type;
    a MISFET of another conductivity type; and
    a film being arranged above both of said MISFETs,
    wherein a direction of stress of said film varies along a direction of a film thickness, and
    wherein the direction of the stress of said film changes at a predetermined thickness point of said film,
    wherein said film has a different thickness on each of said MISFETs, and
    wherein a thinner portion of said film has only a first stress, and a thicker portion of said film has the first stress and a second stress in an opposite direction to that of the first stress.

2. The semiconductor device according to claim 1, wherein said MISFETs have the first stress in one direction at channel regions thereof, and
    wherein said film has the second stress in another direction opposite to said one direction at a bottom surface thereof.

3. The semiconductor device according to claim 2, wherein the first stress is compressive, and the second stress is tensile.

4. The semiconductor device according to claim 2, wherein the first stress is tensile, and the second stress is compressive.

5. The semiconductor device according to claim 1, wherein the film comprises an etching stopper film for the MISFETs.

6. The semiconductor device according to claim 1, wherein the film is formed on gates of the MISFETs.

7. The semiconductor device according to claim 1, wherein respective portions of the film on said MISFETs are identical in composition.

8. The semiconductor device according to claim 1, wherein a main component of the film comprises silicon nitride.

9. The semiconductor device according to claim 1, further comprising:
    channel regions corresponding to said MISFETs,
    wherein the film sets the direction of the stress along the film thickness related to a stress of said film on the channel regions.

10. The semiconductor device according to claim 1, further comprising:
    channel regions corresponding to said MISFETs,
    wherein stress directions are different on respective channel regions of said MISFETs.

11. The semiconductor device according to claim 1, wherein the film has a maximum stress at a bottom layer along the film thickness in a first direction, and a maximum stress at a top layer along the film thickness in a second direction, opposite to the first direction.

12. A semiconductor device, comprising:
    a metal-insulator-semiconductor field-effect transistor (MISFET) of one conductivity type;
    a MISFET of another conductivity type; and
    a film being arranged above both of said MISFETs,
    wherein a direction of stress of saidfilm varies along a direction of a film thickness. and
    wherein the direction of the stress of said film changes at a predetermined thickness point of said film, and
    wherein the stress on the film gradually changes from a tensile force to a compression force along the direction of said film thickness.

13. A semiconductor device, comprising;
    a transistor having a current path on a substrate; and
    a film being arranged above said transistor and having a top surface and a bottom surface thereof in parallel to said substrate,
    wherein said film has a first stress at said top surface and a second stress opposite to said first stress at said bottom surface,
    wherein said film comprises a single film, and
    wherein stress on the film gradually changes from the first stress to the second stress along a direction of a film thickness.

14. The semiconductor device according to claim 13, further comprising;
    a channel region in said substrate,
    wherein the film sets a direction of the stress along the film thickness related to a stress of said film on the channel region.

15. The semiconductor device according to claim 13, wherein the film has a maximum stress at the top surface in a first direction, and a maximum stress at the bottom surface in a second direction, opposite to the first direction.

16. The semiconductor device according to claim 13, wherein said top surface and said bottom surface of said film arc placed above an upper surface of said transistor.

* * * * *